(12) United States Patent
Nagata

(10) Patent No.: US 6,177,816 B1
(45) Date of Patent: *Jan. 23, 2001

(54) INTERFACE CIRCUIT AND METHOD OF SETTING DETERMINATION LEVEL THEREFOR

(75) Inventor: Kyoichi Nagata, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/097,660

(22) Filed: Jun. 16, 1998

(30) Foreign Application Priority Data

Jun. 17, 1997 (JP) ................................................ 9-159630

(51) Int. Cl.[7] .......................................... H03K 19/0175
(52) U.S. Cl. .............................. 327/77; 327/88; 327/89
(58) Field of Search ........................... 327/52–54, 72–80, 327/88, 89, 562, 563, 333; 326/62, 63, 80, 68, 81; 330/252, 254, 253, 257

(56) References Cited

U.S. PATENT DOCUMENTS

| | | | |
|---|---|---|---|
| 4,845,672 | * 7/1989 | Watanabe et al. | 365/190 |
| 5,180,929 | * 1/1993 | Kokubun | 327/50 |
| 5,473,567 | * 12/1995 | McClure | 327/52 |
| 5,568,073 | * 10/1996 | McClure | 327/51 |
| 5,617,045 | * 4/1997 | Asahina | 327/89 |
| 5,726,592 | * 3/1998 | Schulte et al. | 327/65 |

FOREIGN PATENT DOCUMENTS

| | | |
|---|---|---|
| 5-67951 | 3/1993 | (JP) . |
| 7-240679 | 9/1995 | (JP) . |
| 64-81521 | 3/1989 | (KR) . |
| 6-326588 | 11/1994 | (KR) . |

* cited by examiner

*Primary Examiner*—Tuan T. Lam
(74) *Attorney, Agent, or Firm*—Sughrue, Mion, Zinn, Macpeak & Seas, PLLC

(57) ABSTRACT

An interface circuit includes first and second current mirrors, first and second input circuits, and a reference setting unit. Each of the first and second current mirror circuit has a current input terminal and a current output terminal. The first input circuit has a first transistor having a gate to which an input signal is input and a drain connected to the current output terminal of the first current mirror circuit. The second input circuit has a second transistor having a gate to which a predetermined reference voltage is input and a drain connected to the current output terminal of the second current mirror circuit. The reference setting unit is connected to the current input terminal to set a current amount flowing to the current output terminal as a logic determination level of the first transistor. A method of setting a determination level for the interface circuit is also disclosed.

16 Claims, 8 Drawing Sheets

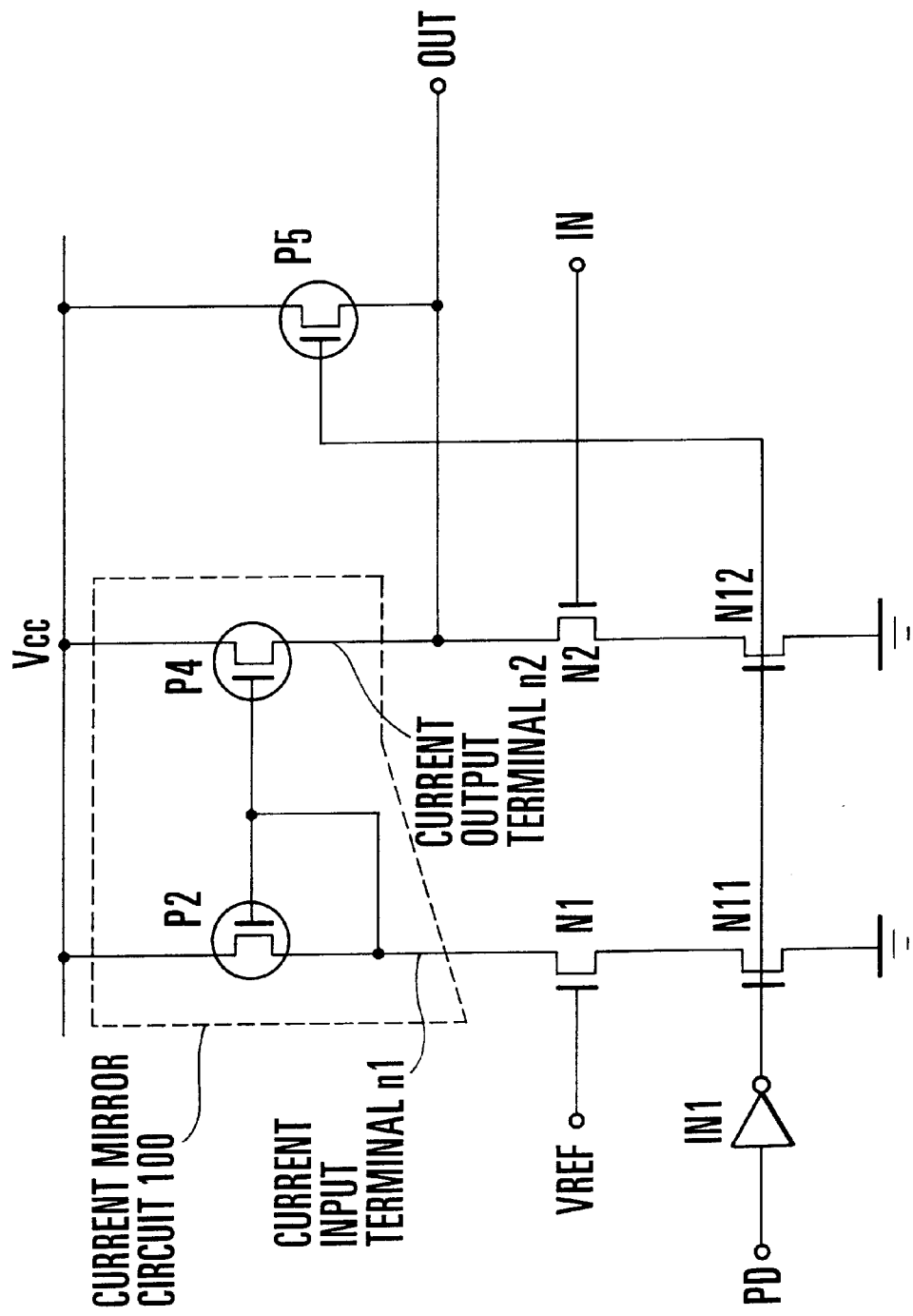
F I G. 1

INTERFACE CIRCUIT AND METHOD OF SETTING DETERMINATION LEVEL THEREFOR

BACKGROUND OF THE INVENTION

The present invention relates to an interface circuit for processing a signal with a small amplitude.

In recent years, the operation speeds of CPUs are increasing, and a signal of a several hundred MHz is often transferred between a CPU and a memory or a peripheral device. In a conventional logic circuit of a 0–5 V system, however, the output cannot follow up the input, or a high power is necessary for follow-up, resulting in a large amount of unnecessary noise radiation or a terminal reflected wave. To solve this problem, it is required to arrange an interface circuit called an LVTTL (Low Voltage Transistor Transistor Logic) or an SSTL (Stub Series Terminated Logic) for processing a high-speed signal with a small amplitude at the input/output portion of a device and connect it to the internal logic circuit. A signal based on the LVTTL has an amplitude of ±0.6 V centered on a reference voltage of 1.4 V. A signal based on the SSTL standard has an amplitude of ±0.2 V centered on a reference voltage of 1.5 V.

A device such as a CPU or a memory is currently often used in a battery-driven apparatus such as a portable personal computer. The battery voltage for such an apparatus is conventionally 6 V and recently lowers to 4.5 V or 3 V. Accordingly, the device is also required to operate at a low voltage and therefore must be designed to operate even when the internal power supply voltage stabilized in the device is as low as 3.3 V or 2 V.

FIG. 8 shows the arrangement of such an interface circuit (to be referred to as prior art 1 hereinafter). Referring to FIG. 8, reference symbols P1 to P4 denote p-type transistors; and N1 to N3, n-type transistors. In FIG. 8, a voltage of 3.3 V is used for a power supply Vcc. A reference voltage VREF of 1.4 V is set. The amplitude of an input signal IN to be input is VREF ±0.6 V.

The connection relationship in the circuit shown in FIG. 8 will be described.

The sources of the p-type transistors P1 and P3 are connected to the power supply, the gates are connected to a power down signal PD, and the drains are connected to the sources of the p-type transistors P2 and P4 constituting a current mirror, respectively. The gates of the p-type transistors P2 and P4 constituting the current mirror are connected to the drain of the transistor P2. The drain of the n-type transistor N1 is connected to the drain of the transistor P2, the gate is connected to the reference voltage, and the source is connected to the ground. The drain of the n-type transistor N2 is connected to the drain of the transistor P4 and an output terminal OUT, the gate is connected to the input terminal IN, and the source is connected to the ground. The drain of the n-type transistor N3 is connected to the output terminal OUT, the gate is connected to the power down signal PD, and the source is connected to the ground.

The operation of the circuit shown in FIG. 8 will be described next.

The transistors P1, P3, and N3 prevent this interface circuit from flowing a current in an inoperative or standby state. The control signal for these transistors is output from a CPU (not shown) or the like. When the power down signal PD goes high, the transistors P1 and P3 are turned off, and the transistor N3 is turned on. No current flows to the interface circuit, and the output OUT is set at low level. On the other hand, when the power down signal PD goes low, the transistors P1 and P3 are turned on, and the transistor N3 is turned off. A signal following up the input signal IN is output from the output OUT to access, e.g., a memory circuit (not shown). In the following description, assume that the power down signal PD is at low level, i.e., the transistors P1 and P3 are ON, and the transistor N3 is OFF unless otherwise specified.

The reference voltage VREF of, e.g., 1.4 V is input to the gate of the transistor N1, and a current corresponding to this voltage flows to the drain. The gates of the transistors P2 and P4 are connected to the drain of the transistor P2 to constitute a so-called current mirror circuit. With this arrangement, a current proportional to the drain current of the transistor N1 is output from the drain of the transistor P4.

The input signal IN is input to the gate of the transistor N2. When the input signal IN has a voltage equal to or lower than the reference voltage VREF of 1.4 V, the current drawing capability of the transistor N2 is lower than the current supply capability of the transistor P4. Therefore, the output OUT is set at high level. When the level of the received input signal IN is equal to or higher than the reference voltage VREF of 1.4 V, the current drawing capability of the transistor N2 is higher than the current supply capability of the transistor P4, so the output OUT is set at low level.

In the interface circuit shown in FIG. 8, the internal power supply voltage Vcc tends to be about 2 V to allow the operation even at a relatively low battery voltage.

In prior art 1, the transistors P1 and P2 are connected in series between the drain of the transistor N1 and the power supply. This generates a voltage drop corresponding to the sum of threshold values VT of the transistors P1 and P2, so the drain voltage of the transistor N1 is lower than the power supply voltage. On the other hand, the reference voltage VREF is set at 1.4 V based on the standard and cannot be changed. If the threshold value VT of the transistors P1 and P2 varies and exceeds 0.3 V, the drain voltage of the transistor N1 become lower than 1.4 V, and the transistor N1 does not operate. This also applies to the transistor N2.

To allow the operation in such a case while satisfying the DC characteristics of the interface circuit, the gate length (gate area) ratio of the transistor P2 to the transistor N1 and that of the transistor P4 to the transistor N2 must be increased.

However, when the gate area of the transistor P4 is increased to optimize the DC operating point, the parasitic capacitance on the drain side of the transistor N2 increases to disable the high-speed operation of the interface circuit.

This delays access from the interface circuit to the internal circuit such as a memory circuit. When a high-speed signal of 200 MHz is input as the input signal IN, the operation of the interface circuit is disabled.

Another problem is also posed.

The reference voltage of the input signal changes depending on the scheme and is set at 1 V, 1.4 V, or 1.5 V. Conventionally, interface circuits of various schema are formed in a device and switched as needed. However, the interface circuits must be arranged in units of input/output terminals. When circuits corresponding to various schema are formed in a device having a lot of input/output terminals, the chip size increases. Therefore, it is required to make an interface circuit compatible with any scheme.

To meet this requirement, in Japanese Patent Laid-Open No. 7-240679 (to be referred to as prior art 2 hereinafter), the constant current amount of a differential amplifier circuit is changed in response to a change in reference voltage, thereby preventing an increase in circuit current even when the reference voltage rises.

As another known means disclosed in Japanese Patent Laid-Open No. 5-67951 (to be referred to as prior art 3 hereinafter), the output from the interface circuit is integrated through a low-pass filter, and the integrated voltage is fed back. This arrangement allows self correction even when the DC level of the input signal or the threshold voltage of the input circuit varies.

Although prior art 2 discloses a technique of keeping current consumption constant even when the reference voltage changes, a measure against a decrease in power supply voltage is not disclosed. Generally, when the power supply voltage lowers, and the current of the constant current circuit is decreased, the gain of the differential amplifier circuit lowers, and the response time in the high-frequency characteristics is also prolonged.

In prior art 3, correction to the optimum operating point is allowed even when the reference voltage lowers. However, while the device is operating, the low-pass filter or the feedback circuit must be kept operating, resulting in an increase in power consumption.

SUMMARY OF THE INVENTION

Is it the first object of the present invention to provide an interface circuit for outputting an output signal following up a high-speed input signal even when the internal power supply voltage of the interface circuit is low.

It is the second object of the present invention to provide an interface circuit allowing self correction to an optimum operating point even when the transistor characteristics vary.

It is the third object of the present invention to provide an interface circuit allowing self correction to an optimum operating point even in a plurality of transmission schema using different reference voltages.

It is the fourth object of the present invention to provide an interface circuit for preventing an increase in power consumption even in self correction.

In order to achieve the above object, according to the present invention, there is provided an interface circuit comprising first and second current mirror circuits each having a current input terminal and a current output terminal, a first input circuit having a first transistor having a gate to which an input signal is input and a drain connected to the current output terminal of the first current mirror circuit, a second input circuit having a second transistor having a gate to which a predetermined reference voltage is input and a drain connected to the current output terminal of the second current mirror circuit, and reference setting means, connected to the current input terminal, for setting a current amount flowing to the current output terminal as a logic determination level of the first transistor.

BRIEF DESCRIPTION OF THE DRAWINGS

FIG. 1 is a circuit diagram showing an interface circuit according to the first embodiment of the present invention;

DESCRIPTION OF THE PREFERRED EMBODIMENTS

Figure 2:
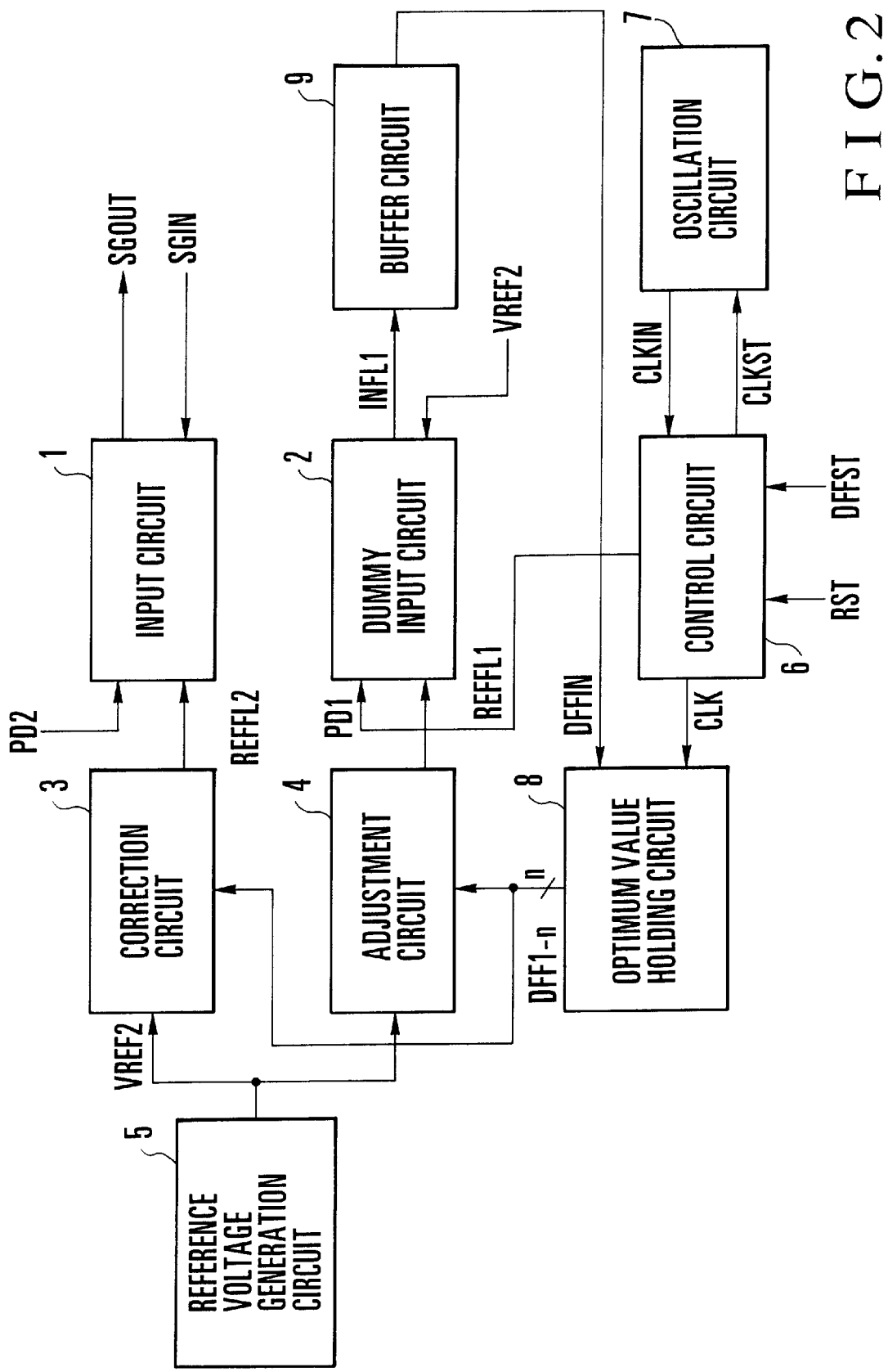
FIG. 2 is a block diagram showing an interface circuit according to the second embodiment.

The present invention will be described below with reference to the accompanying drawings.

FIG. 1 shows an interface circuit according to the first embodiment of the present invention. In the circuit shown in FIG. 1, a pair of p-type transistors P2 and P4 constitutes a current mirror circuit. The sources of the transistors P2 and P4 are connected to the power supply. The gates of the transistors P2 and P4 are connected to each other and also connected to the drain of the transistor P2. The drain of the transistor P2 will be called a current input terminal, and the drain of the transistor P4 will be called a current output terminal.

The connection relationship in the circuit shown in FIG. 1 will be described next.

The drains of the p-type transistors P2 and P4 are connected to the drains of a pair of n-type transistors N1 and N2, respectively. The drain of the transistor N2 is also connected to an output terminal OUT. The gate of the transistor N1 is connected to a reference voltage VREF terminal. The gate of the transistor N2 is connected to an input signal IN terminal. The sources of the transistors N1 and N2 are connected to the drains of n-type transistors N11 and N12, respectively. The sources of the n-type transistors N11 and N12 are grounded, and the gates of these transistors are connected to a power down signal PD terminal through an inverter IN1. A p-type transistor P5 has a drain connected to the power supply, a gate connected to the gate of the transistor N12, and a source connected to the output terminal OUT. The transistors P2, N1, and N11 constitute a first series circuit (first circuit), and the transistors P4, N2, and N12 constitute a second series circuit.

In this interface circuit, the circuit current cutoff transistors N11 and N12 for setting the interface circuit in an operative or inoperative state in accordance with the signal PD are connected in series (cascade-connected) to the n-type transistors N1 and N2 for receiving the reference voltage VREF and the input signal IN, respectively. Each of the transistors N11 and N12 comprises an n-type transistor.

Reference symbol P5 denotes a p-type transistor; and IN1, an inverter. In FIG. 1, the signal PD sets the circuit in an inoperative state and is called a standby signal, a current cutoff signal, or a power down signal. This signal PD is generated in the device or outside the device, i.e., on the CPU side.

The operation of the interface circuit shown in FIG. 1 will be described next.

When the power down signal PD goes high, the output from the inverter IN1 is set at low level to turn off both the transistors N11 and N12, and no current flows to the first and second series circuits. As a result, the current consumption in the inoperative state can be reduced. At this time, the p-type transistor P5 is turned on to prevent a variation in output from the output terminal OUT in the inoperative state.

On the other hand, when the power down signal PD goes low, the output from the inverter IN1 is set at high level to turn on both the transistors N11 and N12. A desired current flows to the first and second series circuits. Since the p-type transistor P5 is turned off, the output from the second series circuit is directly output to the output terminal OUT. The operation will be described below assuming that the power down signal PD is at low level, i.e., in the operative state unless otherwise specified.

When the reference voltage VREF is input to the gate of the transistor N1, a drain current corresponding to the characteristics of the transistor N1 flows. This current is input to a current input terminal n1 of the current mirror circuit constituted by the transistors P2 and P4, and a current proportional to this current is output from a current output terminal n2. The ratio of a current i1 at the current input terminal n1 to a current i2 at the current output terminal n2 can be freely selected by changing the size ratio of the transistor P2 to the transistor P4. In this case, assume that currents with the same value flow.

Next, an input signal is input to the input IN. When the voltage of the input signal is lower than the reference voltage VREF, the current flowing to the transistor N2 is smaller than the current i2, so the output is set at high level. Conversely, when the input voltage IN is higher than the reference voltage VREF, the current flowing to the transistor N2 is larger than the current i2, so the output is set at low level.

With this arrangement, even when the power supply voltage (internal power supply voltage) Vcc of the first circuit constituted by the transistors P2, N1, and N11 becomes as low as, e.g., about 2 V, the drain voltage of the transistor N1 lowers only by a threshold voltage VT of the p-type transistor P2. For this reason, even when the threshold value VT changes to 0.3 V, a voltage of 1.7 V can be ensured as the drain voltage of the transistor N1, and inversion of voltages between the gate and the drain can be prevented. This also applies to the transistor N2. Therefore, the output signal OUT following up the high-speed input signal IN can be output.

Since each of the set of the n-type transistors N1 and N11 and the set of the n-type transistors N2 and N12 has a cascade structure, the gate length ratio of the transistor P2 to the transistor N1 which constitute the first circuit can be decreased. Therefore, an output signal following up the high-speed input signal IN can be obtained. Note that the power supply voltage Vcc is set at 3.3 or 2 V.

In the SSTL, the reference voltage VREF to be supplied to the transistor N1 of the first circuit must be set at 1.5 V within the range of 1.3 to 1.7 V. In addition, the amplitude of the input signal IN to be input must be VREF ±0.2 V.

The transistors N1 and N2 do not employ a differential amplification scheme but are grounded through the independent transistors N11 and N12, respectively. In an arrangement wherein the sources of the transistors N1 and N2 are commonly connected to a low-current transistor, when noise is superimposed on the signal input to the input IN of the transistor N2, the noise is transmitted to the gate of the transistor N1 through the sources of the transistors N1 and N2 and then to another interface circuit through the reference voltage interconnection. This varies the reference voltage, resulting in an erroneous operation. In the interface circuit of this embodiment, since the transistors N1 and N2 are independently grounded, noise is hardly transmitted to the reference voltage side, so no erroneous operation readily occurs.

In addition, the transistors P2 and P4 or the transistors N1 and N2 need not have the same size. Since the transistors P2 and N1 which are not concerned with the output driving capability can be smaller than the transistors P4 and N2, the chip size can be reduced. Furthermore, since the transistors N1 and N2 are independently grounded, design can be facilitated as compared to the differential amplification scheme.

FIG. 2 shows an interface circuit according to the second embodiment. By setting an optimum operating point for the interface circuit, a signal following up a high-speed input signal can be output even when the power supply voltage is low or the reference voltage changes in correspondence with another signal scheme.

In the block diagram of FIG. 2, reference numeral 1 denotes an input circuit (first input circuit) as an interface circuit; 2, a dummy input circuit (second input circuit); 3, a correction circuit; 4, an adjustment circuit; 5, a reference voltage generation circuit; 6, a control circuit; 7, an oscillation circuit for generating a clock signal; 8, an optimum value holding circuit; and 9, a buffer circuit. The reference voltage generation circuit 5 for generating a desired voltage VREF2 plays a role different from that of the reference voltage VREF in the first embodiment. More specifically, the voltage VREF2 is supplied to the input terminal of the dummy input circuit 2 as a predetermined reference voltage. However, the reference voltage VREF2 is also input to the correction circuit 3 and the adjustment circuit 4 to limit the amount of a current flowing to each transistor array (to be described later). Therefore, the voltage VREF2 need not always be a reference voltage for the latter circuits.

The adjustment circuit 4 need not always have the same arrangement as that of the correction circuit 3.

The dummy input circuit 2 has almost the same arrangement as that of the input circuit 1. A circuit group constituted by the dummy input circuit 2, the buffer circuit 9, the optimum value holding circuit 8, the correction circuit 3, and the adjustment circuit 4 supplies an optimum corrected current value REFFL2 to the input circuit 1 as an operating current.

Upon receiving an input signal SGIN, the input circuit 1 discriminates between high level and low level of the input signal SGIN on the basis of the current value REFFL2 corrected by the correction circuit 3 and outputs an output signal SGOUT.

The interface circuit has three operation steps.

In the first step, the interface circuit finds the optimum operating point at the start of the operation. In the second step, the optimum operating point is set for the correction circuit. In the third step, the dummy input circuit 2 stops its operation, and the input circuit 1 starts the normal operation.

The first step will be described.

When the power is turned on, and a reset signal RST is inverted, the control circuit 6 disables a clock stop signal CLKST to cause the oscillation circuit 7 to start its operation for outputting a clock signal CLKIN. The control circuit 6 starts supplying a clock CLK to the optimum value holding circuit 8 and inverts a power down signal PD1 to set the dummy input circuit 2 in an operative state.

The optimum value holding circuit 8 is constituted by n data latch circuits and has n binary outputs DFF1 to DFFn. The optimum value holding circuit 8 is initially set in a random output state. The adjustment circuit 4 determines a current amount REFFL1 flowing from the current input terminal of the dummy input circuit 2 in accordance with the output value of the optimum value holding circuit 8.

The reference voltage VREF2 corresponding to the signal scheme of the input signal SGIN is input to the input terminal of the dummy input circuit 2, and the current amount REFFL1 adjusted by the adjustment circuit 4 is input to the current input terminal of the dummy input circuit 2. The dummy input circuit 2 outputs a signal of high level or low level to an output INFL1. For example, when the prescribed reference voltage VREF2 is input to the gate of a transistor N2', and the adjusted current amount REFFL1 is larger than the current value at the optimum operating point, a signal of high level is output; otherwise, a signal of low level is output. The output INFL1 is inverted and amplified through the buffer circuit 9 and input to the optimum value holding circuit 8 as a signal DFFIN. When the clock CLK rises, the signal DFFIN is held by the optimum value holding circuit 8, and simultaneously, the outputs DFF1 to DFF7 are shifted to DFF2 to DFF8, respectively.

One of the n binary outputs DFF1 to DFFn of the optimum value holding circuit 8 is rewritten by the signal DFFIN, and in this state, the adjustment circuit 4 is set again to change the current amount REFFL1. In this state, it is determined again whether the output INFL1 from the dummy input circuit 2 is at high level or low level, and the adjusted signal DFFIN is input to the optimum value holding circuit 8 through the buffer circuit 9. The corrected signal DFFIN is stored at the rise of the clock CLK.

By repeating this operation at least n times, the operating point can be converged to the optimum operating point, and the first step is ended. The completion signal is generated by counting the clock CLK a predetermined number of times. Alternatively, in a memory, the completion signal may be generated upon detecting the first-time change in a signal RAS after power-on.

In the second step, the output from the optimum value holding circuit 8, which is obtained in the first step, is transferred to the correction circuit 3, and the current amount REFFL2 equal to the current amount REFFL1 is flowed to the correction circuit 3.

In the third step, the optimum current amount REFFL2 set for the correction circuit 3 is supplied to the input circuit 1, the logic level of the input signal SGIN is determined at the optimum operating point, and the result is output from the output terminal SGOUT. The control circuit 6 inverts the clock control signal CLKST to cause the oscillation circuit 7 to stop oscillation and also inverts the power down signal PD1 to set the dummy input circuit 2 in an inoperative state.

To restart the first to third steps, a signal corresponding to the reset signal RST is input from the CPU or the like. With this operation, the clock stop signal CLKST and the power down signal PD1 can be inverted to perform the correction operation again.

As described above, when the operating point is corrected to the optimum point in accordance with the given power supply voltage or reference voltage, the interface circuit can be satisfactorily operated by a signal with a high frequency.

In prior art 3, since analog correction is performed, the feedback circuit must be always kept operating, resulting in an increase in power consumption of the circuit. In the second embodiment, the operation of detecting the correction amount is performed in a limited period of power on or restoration from the standby state. In the remaining period, the current flow to the dummy input circuit 2 is stopped by the power down function, so the current consumption hardly increases. In addition, the correction amount detected once is digitally stored in the optimum value holding circuit and does not change over time.

Figure 3:
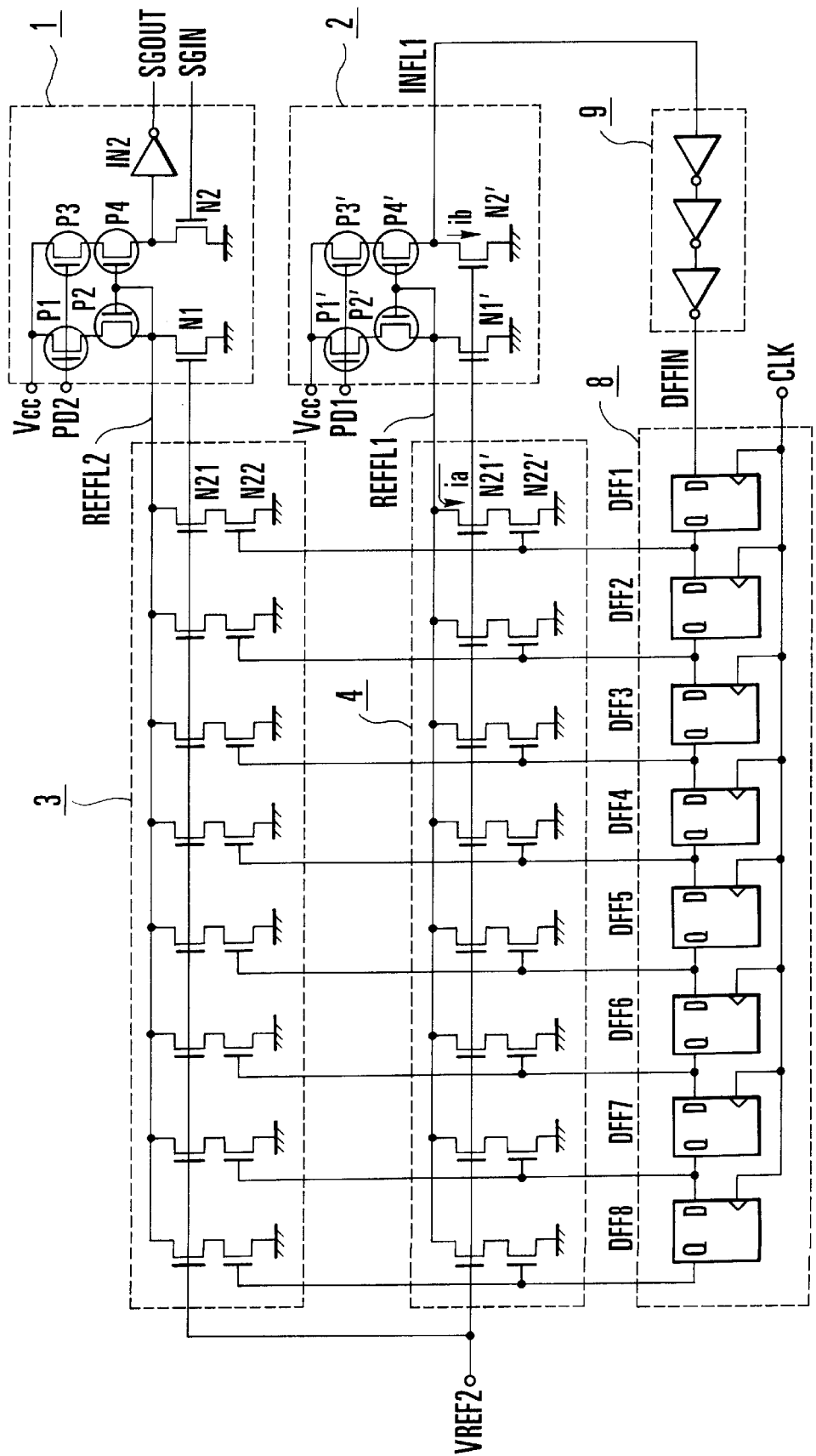
FIG. 3 is a circuit diagram of the interface circuit shown in FIG. 2.
Figure 8:
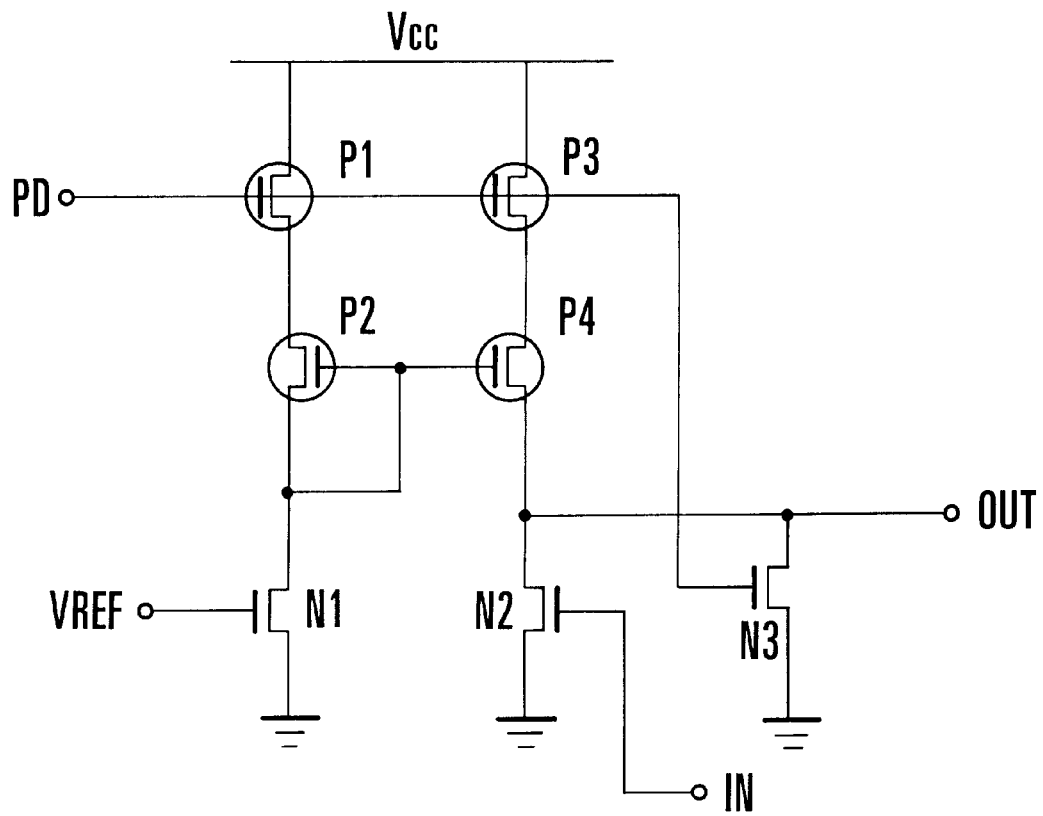
FIG. 8 is a circuit diagram of a conventional interface circuit.

FIG. 3 shows details of the interface circuit shown in FIG. 2. In FIG. 3, the input circuit 1 has the same arrangement as that of the conventional interface circuit shown in FIG. 8 except that the current input terminal of the first current mirror circuit constituted by the p-type transistors P2 and P4 is connected to the output REFFL2 of the correction circuit 3. The input circuit 1 has four p-type transistors P1 to P4, two n-type transistors N1 and N2, and an inverter IN2. A power supply voltage Vcc is supplied to the sources of the transistors P1 and P3. A power down signal PD2 is supplied to the gate of the transistor P1. The reference voltage VREF2 is supplied to the gate of the transistor N1, and a predetermined current is output from the drain of the transistor N1. This drain, i.e., the current input terminal of the current mirror circuit is corrected by the correction circuit 3 to the optimum current amount REFFL2. With this operation, the current amount of the current mirror circuit is corrected, and the current amount flowing to the transistor P2 is optimized. Even when the internal voltage applied to the transistor N1 of the first circuit lowers, the transistor P4 is turned on to supply the operating voltage to the transistor N2. In this case, when the signal SGIN is input to the gate of the transistor N2, the transistor N2 determines the level of the input signal SGIN on the basis of the corrected current amount REFFL2. The signal SGOUT following up the input signal SGIN can be output from the drain, i.e., the connection point between the transistors P4 and N2 through the inverter IN2.

The dummy input circuit 2 has four p-type transistors P1' to P4' and two n-type transistors N1' and N2', like the input circuit 1. In this dummy input circuit 2 as well, the power supply voltage Vcc is supplied to the sources of the transistors P1' and P3', and the power down signal PD1 is supplied to the gates of the transistors P1' and P3'. The drains of the transistors P1' and P3' are connected to the those of the transistors N1' and N2', respectively. The reference voltage VREF2 is supplied to the gates of the transistors N1' and N2', and a predetermined current is output from the drains. The drain current of the transistor P2' constituting a second current mirror circuit having the transistors P2' and P4' is adjusted by the adjustment circuit 4 and given as the current amount REFFL1. The corrected current also flows to the current output terminal of the current mirror circuit, i.e., the drain of the transistor P4' and then to the transistor N2'. Generally, the voltage drop between the source and the drain of the transistor P2' or P4' depends on the drain current and becomes smaller as the drain current becomes large. Therefore, when the power supply voltage Vcc is low, and the current flowing to the current mirror is small, the drain voltage of the transistors N1' and N2' lowers to stop the operation of the circuit. In this state, when the adjusted current amount REFFL1 is 0, some current is drawn from the drain of the transistor N2' because the reference voltage VREF2 is connected to the gate of the transistor N2'. Since the current supply amount from the drain of the transistor P4' is smaller than the current drawing amount, the output INFL1 lowers. The output DFFIN from the buffer 9 is inverted to high level.

Conversely, when the adjusted current amount REFFL1 is too large, the current supply amount from the transistor P4' is larger than the current drawing amount of the transistor N2'. The output INFL1 rises, and the output DFFIN from the buffer 9 is set at low level. This signal DFFIN is supplied to the optimum value holding circuit 8 and held.

In this embodiment, the correction circuit 3 and the adjustment circuit 4 have the same arrangement. Two n-type transistors are connected in series to form a series circuit, and eight series circuits are connected in parallel. The drains of the transistors N21 and N21' on the upper side of each series circuit are individually connected to the current output terminal to determine the corrected current amount REFFL1 or REFFL2 from the drain to the input circuit 1 or 2. The reference voltage VREF2 is supplied to the drain of the upper-side transistor of each series circuit to determine the current amount to be flowed to the transistor. In this embodiment, the reference voltage VREF2 is used. However, this voltage need not always be a reference voltage as long as it is a predetermined voltage. The upper-side transistors can be omitted as long as the output voltage of the optimum value holding circuit 8 does not vary. In this case, the drains of the transistors N22 and N22' on the lower side are individually connected to the current output terminal.

The optimum value holding circuit 8 is constituted by eight D-type flip-flop circuits (to be referred to as FF circuits hereinafter) FF1 to FF8. Each of the outputs DFF1 to DFF8 of the FF circuits is connected to the gates of the lower-side transistors of corresponding transistor series circuits in the correction circuit 3 and the adjustment circuit 4. In this embodiment, the FF circuits are used. However, a shift register or the like may be used.

The outputs DFF1 to DFF7 from the FF circuits FF1 to FF7 in the optimum value holding circuit 8 are input to the FF circuits FF2 to FF8, respectively. The FF circuits FF2 to FF8 latch the inputs in synchronism with the clock CLK. Simultaneously, upon receiving the signal DFFIN from the buffer circuit 9, each of the FF circuits FF2 to FF8 latches a signal of the level corresponding to the input signal. The output from each of the FF circuits FF1 to FF8 is individually input to the gates of the lower-side transistors of corresponding transistor series circuits in the correction circuit 3 and the adjustment circuit 4. With this arrangement, the lower-side transistors in the correction circuit 3 and the adjustment circuit 4 are ON/OFF-controlled. At this time, the upper-side transistors in the correction circuit 3 and the adjustment circuit 4 are set by the reference voltage VREF2 in a state allowing to flow a predetermined current. Therefore, ON/OFF of each transistor series circuit in the correction circuit 3 and the adjustment circuit 4 depends on whether the output from a corresponding FF circuit is at high level or low level. Therefore, the current amounts REFFL2 and REFFL1 to be supplied from the correction circuit 3 and the adjustment circuit 4 to the input circuits 1 and 2, respectively, are determined by the number of transistor series circuits in the ON or OFF state in the correction circuit 3 and the adjustment circuit 4. As the number of ON transistors increases, the current amounts REFFL2 and REFFL1 flowing to the correction circuit 3 and the adjustment circuit 4 increase.

Figure 4:
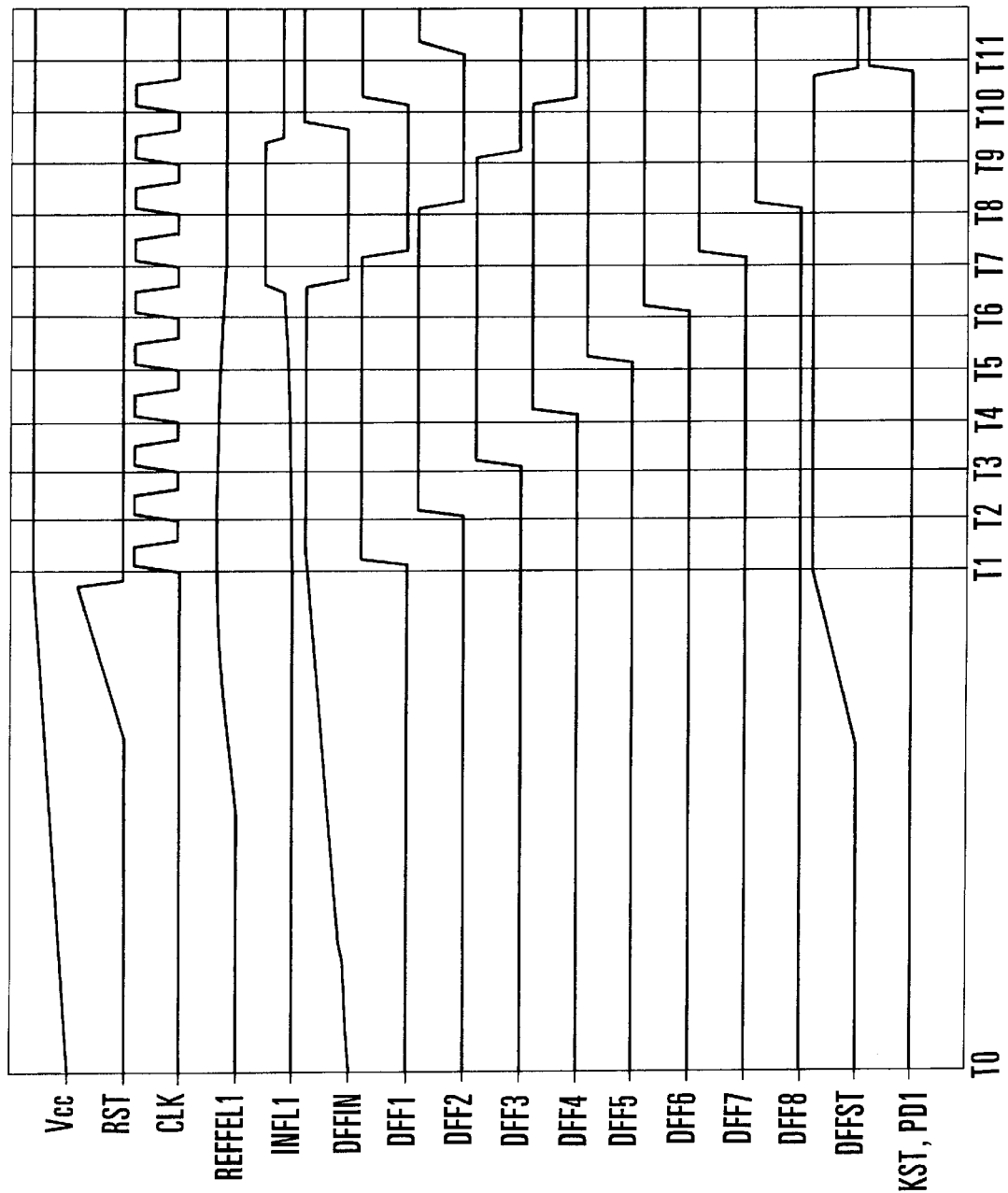
FIGS. 4A to 4P are timing charts showing the operations of various portions of the circuit shown in FIG. 3.

FIGS. 4A to 4P show the operation waveforms of various portions of the interface circuit shown in FIGS. 2 and 3. The operation of the interface circuit will be described with reference to the timing charts.

At time T0, when the circuit is powered on, the power supply voltage Vcc gradually increases (FIG. 4A).

Immediately before T1, assuming that all the outputs from the optimum value holding circuit 8 are at low level, all the lower-side transistors of the adjustment circuit 4 are OFF, and the adjusted current amount REFFL1 is 0. Since the reference voltage VREF2 is being input to the gate of the transistor N2', the current drawing amount of the transistor N2' is larger than the current supply amount of the transistor P4', so the output INFL1 is set at low level. This output is inverted by the buffer circuit 9 to high level (time T0 in FIG. 4E).

A reset circuit (not shown) starts operating in response to the increase in power supply voltage Vcc and generates the reset signal RST (FIG. 4B). The control circuit 6 is reset by the reset signal RST and then disables the clock stop signal CLKST and the power down signal PD1 to set the oscillation circuit 7 and the dummy input circuit 2 in the operative state. Upon receiving the clock CLKIN from the oscillation circuit 7, the control circuit 6 outputs the clock CLK to the optimum value holding circuit 8 (FIG. 4C).

At time T1, when the clock CLK rises, the output DFFIN from the buffer circuit 9 is held by the first FF circuit DFF1 of the optimum value holding circuit 8, and the output DFF1 is set at high level (FIG. 4G). An output Q from each of the FF circuits FF1 to FF7 is transferred to an input D of a corresponding one of the subsequent FF circuits FF2 to FF8 and latched when the clock goes high at time T1. As a result, the FF circuit FF1 is kept at high level, and the FF circuits FF2 to FF8 are kept at low level.

The outputs DFF1 to DFF8 from the FF circuits are sent to the adjustment circuit 4 and the correction circuit 3. Only one of the eight transistor series circuits, i.e., the transistor series circuit corresponding to the output DFF1, i.e., is turned on. Let ia be the current flowing to one transistor, i.e., the transistor N1', and ib be the current flowing to the transistor N2'. As a result, as the adjusted current amount REFFL1, the current ia corresponding to one transistor series circuit flows (FIG. 4D). The current flowing from the current input terminal of the current mirror circuit has a value obtained by adding the drain current ia of the transistor N1' to the adjusted current amount REFFL1=ia, i.e., 2·ia. Therefore, the current at the current output terminal of the current mirror circuit, i.e., the drain current of the transistor P4' is 2·ia, and the level of the output voltage INFL1 slightly rises (FIG. 4E). However, since the current drawing amount ib of the transistor N2' is still dominant (2·ia<ib), the output from the dummy input circuit 2 is kept at low level, and the output from the buffer circuit 9 is kept at high level (FIG. 4F).

At time T2, when the clock CLK goes high again, the inputs to the FF circuits FF1 to FF7 are shifted to the subsequent FF circuits, as at time T1. The outputs from the FF circuits FF1 and FF2 are set at high level, and the outputs from the FF circuits FF3 to FF8 are set at low level. These outputs are sent to the adjustment circuit 4 and the correction circuit 3 to turn on two of the eight transistor series circuits. As a result, the drain current of the transistor P4' increases to 3·ia, and the level of the output voltage INFL1 also slightly rises (FIG. 4E). However, since the current drawing amount of the transistor N2' is still dominant (3·ia<ib), the output from the dummy input circuit 2 is kept at low level, and the output from the buffer circuit 9 is kept at high level (FIG. 4F).

This operation is repeated from time T3 to time T5. At time T6, six of the eight outputs DFF1 to DFF8 from the FF circuits are at high level, and the remaining two outputs are at low level. As a result, a current having a value of 6·ia corresponding to six transistor series circuits flows as the adjusted current amount REFFL1. Since the current ia flowing to the transistor N1' is added, the drain current of the transistor P4' also increases to 6·ia. Since the drain current exceeds the current drawing amount of the transistor N2' (6·ia>ib), the level of the output voltage INFL1 largely increases (FIG. 4E). For this reason, the output from the dummy input circuit 2 changes to high level, and the output DFFIN from the buffer circuit 9 changes to low level (FIG. 4F).

From time T6 to time T8, two of the outputs DFF1 to DFF8 from the FF circuits are kept at low level, and the remaining six outputs are kept at high level.

From time T9, three outputs are kept at low level, and the remaining five outputs are kept at high level (waveforms from time T12 are not illustrated).

In this embodiment, the optimum value of the adjusted current amount REFFL1 is present between 5·ia and 6·ia, as is apparent (FIG. 4D).

At time T10, when an adjustment completion signal DFFST is input, the clock stop signal CLKST is output to the oscillation circuit 7 to stop oscillation, so the oscillation circuit 7 stops output of the clock CLK. In addition, the power down signal PD1 is set at high level and input to the dummy input circuit 2, thereby stopping the current flowing to the dummy input circuit 2 and the adjustment circuit 4.

The adjustment completion signal DFFST is generated upon detecting that the clock CLK from the oscillation circuit 7 is counted a predetermined number of times. In a DRAM, a signal obtained by inverting a row address selection signal RAS for the first time can be used as the adjustment completion signal DFFST.

Even after time T11, three of the outputs DFF1 to DFF8 from the optimum value holding circuit 8 continuously maintain low level, and the remaining five outputs maintain high level, and this state does not change until the next adjustment operation.

The outputs DFF1 to DFF8 from the optimum value holding circuit 8 are also output to the correction circuit 3 to turn on five of the eight transistor series circuits and flow a current corresponding to 5·ia as the corrected current amount REFFL2. A current corresponding to 6·ia flows as the drain currents of the transistors P2 and P4 constituting the current mirror circuit of the input circuit 1.

In this embodiment, the transistors N1 and N1' may be omitted or replaced with the transistor array in the correction circuit 3 or the adjustment circuit 4. The reference voltage corresponding to the signal scheme need be applied to only the gate of the transistor N2'. The reference voltage VREF2 to be supplied to the remaining circuits need not always be a predetermined reference voltage as far as it has a predetermined value. In this embodiment, each transistor array constituent element in the correction circuit 3 or the adjustment circuit 4 has a two-stage structure in which two transistors on the upper and lower sides are connected in series, and the reference voltage is supplied to the gates of the upper-side transistors while the outputs from the optimum value holding circuit 8 are supplied to the lower-side transistors. However, the reference voltage may be supplied to the gates of the lower-side transistors, and the outputs from the optimum value holding circuit 8 may be supplied to the upper-side transistors. Each transistor array constituent element may consist of one transistor, and the gates of the transistors may be connected to the outputs from the optimum value holding circuit 8 while the drains may be connected to the current input terminal.

In this manner, the current amount flowing to the current mirror of the input circuit 1 as the interface circuit can be adjusted. With this arrangement, even when the power supply Vcc of the input circuit 1 lowers from 3.3 V to, e.g., 2.0 V, the optimum current amount REFFL2 adapted to the power supply voltage can be supplied to the input circuit 1. This arrangement effectively functions even when the input signal scheme changes to change the reference voltage or vary the transistor characteristics.

Since the optimum current is supplied to the drain of the transistor P2 in the input circuit 1, the transistors P4 and N2 are set at the optimum operating point, and the transistor N2 can output the high-speed output signal SGOUT following up the high-speed input signal SGIN.

Figure 5:
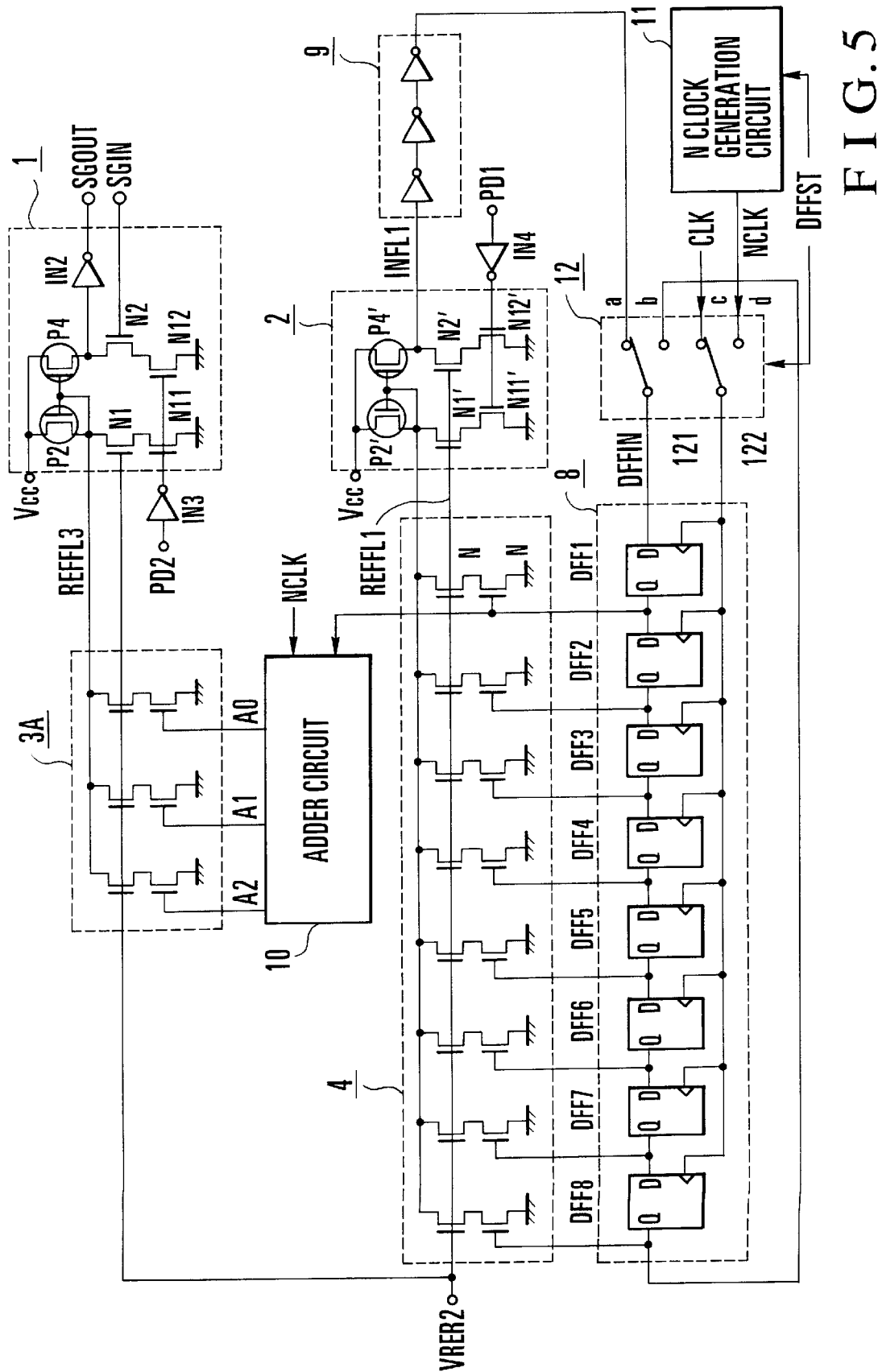
FIG. 5 is a circuit diagram showing an interface circuit according to the third embodiment.

FIG. 5 shows an interface circuit according to the third embodiment.

In this interface circuit, the number of transistors constituting the correction circuit 3 shown in FIG. 3 and the number of connection signal lines between the correction circuit 3 and the optimum value holding circuit 8 are decreased.

In the circuit shown in FIG. 5, a circuit group constituted by a buffer circuit 9, an optimum value holding circuit 8, and an adjustment circuit 4 is the same as that shown in FIG. 3. An optimum current amount REFFL1 can be supplied to a dummy input circuit 2, as in FIG. 3.

In this embodiment, the same arrangement as in the first embodiment is used as an input circuit 1 and the dummy input circuit 2. Inverters IN3 and IN4 are added to match the polarities of power down signals PD1 and PD2 with those in the second embodiment.

A correction circuit 3A of this embodiment uses three transistor series circuits. Generally, letting n be the number of FF circuits of the optimum value holding circuit 8 and m be the number of parallelly connected transistor series circuits in the correction circuit 3A, a relationship $n=2^m$ need hold.

First and second switch circuit s 121 and 122 are connected between the buffer circuit 9 and the optimum value holding circuit 8. The first switch circuit 121 switches between the output from the buffer circuit 9 and the output from an FF circuit FF8 and inputs the selected signal to an FF circuit FF1 as DFFIN. The second switch circuit 122 switches between a clock CLK and the output from an N clock generation circuit 11 and supplies the selected clock to the optimum value holding circuit 8 and the like.

The N clock generation circuit 11 generates clocks equal in number to the number n of FF circuits in the optimum value holding circuit 8. In this embodiment, the N clock generation circuit 11 generates eight clocks. The output from the N clock generation circuit 11 is supplied to the optimum value holding circuit 8 and an adder circuit 10 when the second switch circuit 122 is switched to the side of a terminal d.

The outputs from the optimum value holding circuit 8 are connected to the adjustment circuit 4 and the adder circuit 10. The adder circuit 10 performs binary addition of the number of high-level outputs from the optimum value holding circuit 8. The outputs from the adder circuit 10 are connected to the correction circuit 3A.

Each FF circuit in the optimum value holding circuit 8 outputs, from an output terminal Q, a signal of level corresponding to the input signal input to a terminal D in synchronism with a clock NCLK. The output data is shifted to the left side apparently in FIG. 5. The adder circuit 10 counts an output of high level from the first FF circuit DFF1 and adds it every time the clock NCLK is input. The adder circuit 10 outputs code outputs corresponding to the sum to the gates of the lower-side transistors of the transistor series circuits, which are connected to output terminals A0 to A2, respectively, in the correction circuit 3A. More specifically, the adder circuit 10 serially receives the number of high-level outputs from the FF circuits FF1 to FF8 in the optimum value holding circuit 8 eight times, counts the number of high-level outputs, and outputs the counting result as a binary number.

In this embodiment, the transistors N1 and N1' may be omitted or replaced with the transistor array in the correction circuit 3A or the adjustment circuit 4. The reference voltage corresponding to the signal scheme need be applied to only the gate of the transistor N2'. The reference voltage VREF2 to be supplied to the remaining circuits need not always be a predetermined reference voltage as far as it has a predetermined value. In this embodiment, each transistor array constituent element in the correction circuit 3A or the adjustment circuit 4 has a two-stage structure in which two transistors on the upper and lower sides are connected in series, and the reference voltage is supplied to the gates of the upper-side transistors while the outputs from the optimum value holding circuit 8 are supplied to the lower-side transistors. However, the reference voltage may be supplied to the gates of the lower-side transistors, and the outputs from the optimum value holding circuit 8 may be supplied to the upper-side transistors. Each transistor array constituent element may consist of one transistor, and the gates of the transistors may be connected to the outputs from the optimum value holding circuit 8 while the drains may be connected to the current input terminal.

As described above, in this embodiment, since the optimum value holding circuit 8 is constituted by the eight FF circuits FF1 to FF8, the adder circuit 10 can supply a 3-bit code output as one of eight kinds of outputs corresponding to the number of FF circuits from the output terminals A0 to A2 to the correction circuit 3A. Therefore, the number of interconnections between circuits can be decreased, as compared to the arrangement shown in FIG. 3, and the circuit layout can be easily designed.

The transistors of the transistor series circuits in the correction circuit 3A, which are connected to the output terminals A0 to A2 of the adder circuit 10, have different sizes. Assume that the transistor size of the transistor series circuit connected to the output terminal A0 is "1". The transistor size of the transistor series circuit connected to the output terminal A1 is set to be "2", and that of the transistor series circuit connected to the output terminal A2 is set to be "4". In this manner, the transistor size (area) is sequentially changed by a multiple. With this arrangement, a current REFFL3 equal to the corrected current amount REFFL2 output from the correction circuit 3 in FIG. 3 can be supplied to the input circuit 1.

Figure 6:
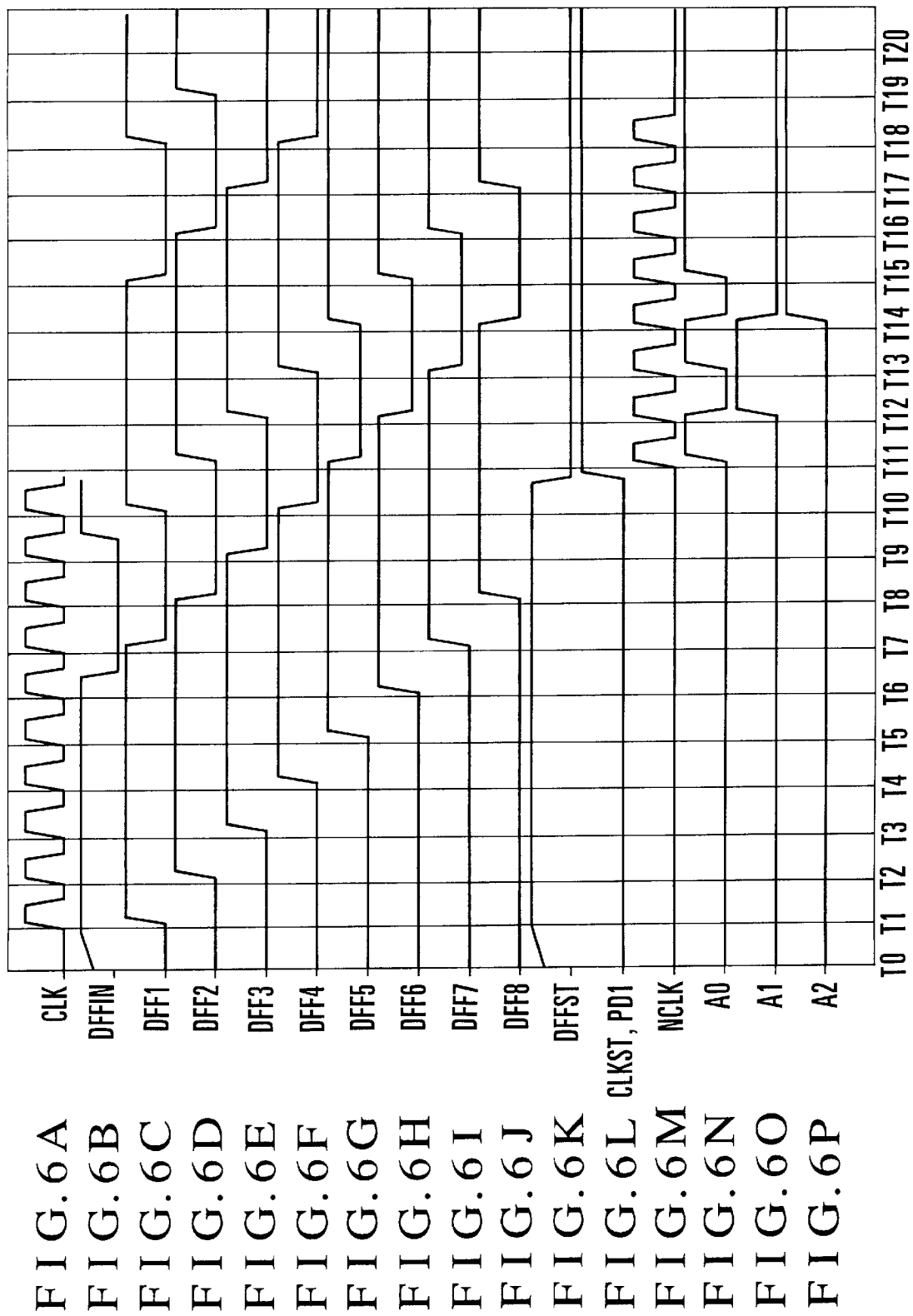
FIGS. 6A to 6P are timing charts showing the operations of various portions of the circuit shown in FIG. 5.

FIGS. 6A to 6P show the operations of various portions of the interface circuit shown in FIG. 5.

The operations from time T1 to time T10 in FIGS. 6A to 6L are the same as those described with reference to FIGS. 4A to 4L, and a detailed description thereof will be omitted.

At time T11, when detection of the optimum value is complete, and an adjustment completion signal DFFST to the optimum value holding circuit 8 goes low (FIG. 6K), a clock stop signal CLKST to the oscillation circuit 7 is sent to stop oscillation of the oscillation circuit 7. The power down signal PD1 to the dummy input circuit 2 is set at high level to stop the current flowing to the dummy input circuit 2 (FIG. 6L). The first switch circuits 121 an 122 are switched from the sides of terminals a and c to the sides of terminals b and d, respectively, to supply the clock NCLK from the N clock generation circuit 11 to the FF circuits in the optimum value holding circuit 8 and the adder circuit 10 (FIG. 6M). At this time, the input to the first FF circuit FF1 of the optimum value holding circuit 8 is switched from the output from the buffer circuit 9 to the output from the final FF circuit FF8. With this operation, levels set in the FF circuits FF1 to FF8 are output to the adder circuit 10 through the output terminal of the first FF circuit FF1. Every time the clock NCLK is input, and when the output from the first FF circuit FF1 is at high level, the adder circuit 10 is incremented by one. That is, the adder circuit 10 counts the number of signals of high level set in the FF circuits FF1 to FF8 and outputs a value corresponding to the counting result from the output terminals A0 to A2 (FIGS. 6N to 6P). In this example, since five of the eight FF circuits output signals of high level until time T18, a value "101" is output from the output terminals A0 to A2 to the correction circuit 3A.

In this embodiment, the optimum value holding circuit 8 has eight FF circuits, and the correction circuit 3A has three sets of transistors. However, the number of FF circuits or transistors can be changed by a $2^m$ step.

In this embodiment, the output from the FF circuit FF1 is connected to the adder circuit. However, the output from the FF circuit FF8 may be directly connected to the adder circuit without using the terminals a and b of the first switch circuit 121.

Figure 7:
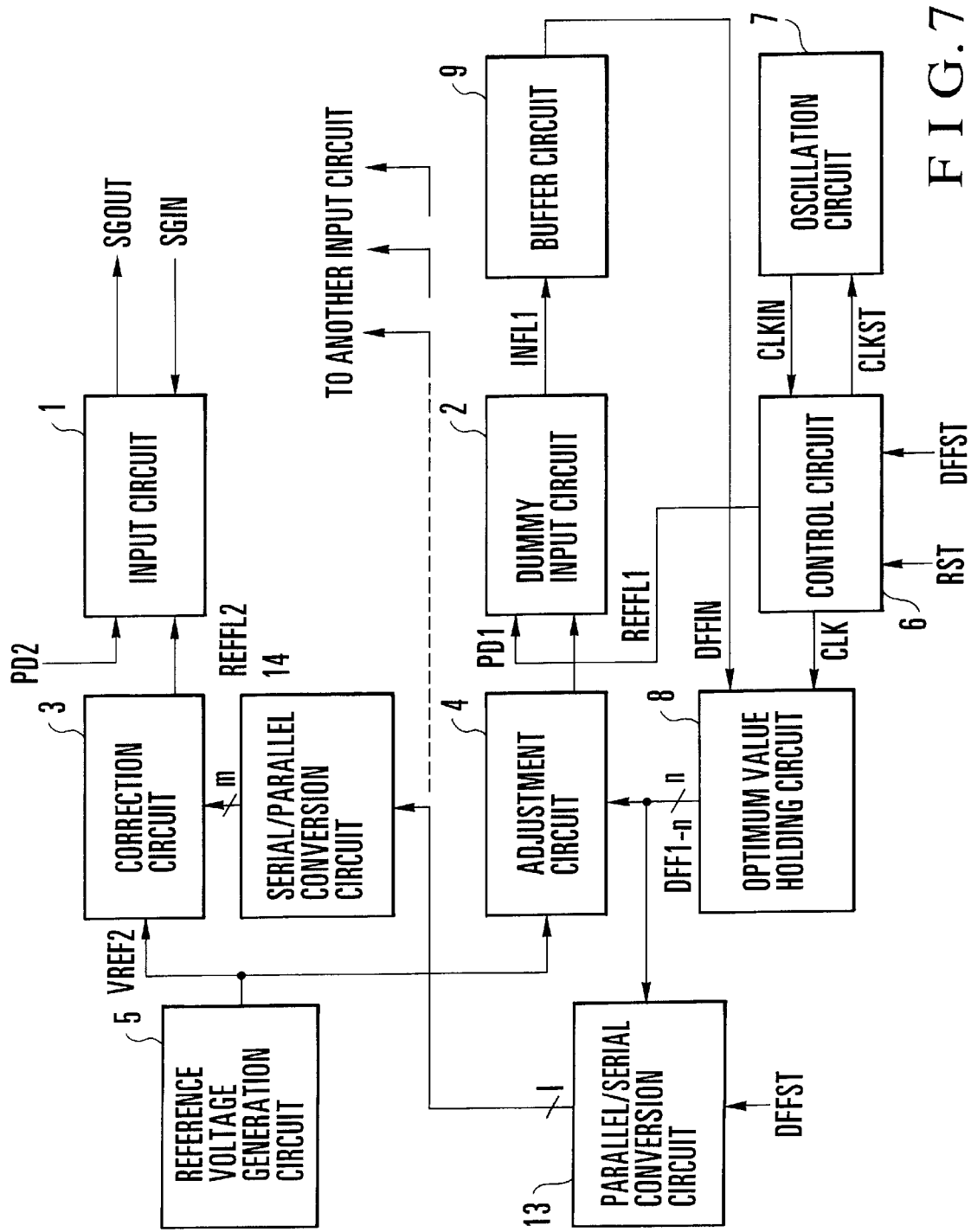
FIG. 7 is a block diagram showing an interface circuit according to the fourth embodiment.

FIG. 7 shows an interface circuit according to the fourth embodiment. A parallel/series conversion circuit 13 and a series/parallel conversion circuit 14 are added to the interface circuit shown in FIG. 3 to further decrease the number of connection signal lines between an optimum value holding circuit 8 and a correction circuit 3. The n signal bits independently output from the FF circuits of the optimum value holding circuit 8 are converted into serial data by the parallel/series conversion circuit 13 and transmitted to the series/parallel conversion circuit 14 through one transmission line. The series/parallel conversion circuit 14 converts the serial data into parallel data of m signal bits and supply the signal bits to the m-bit correction circuit 3. With this arrangement, since the optimum value can be transmitted from the optimum value holding circuit 8 to the correction circuit 3 side as serial data, the number of interconnections between the optimum value holding circuit 8 and the correction circuit 3 can be largely decreased, and the circuit layout can be easily designed.

When the correction circuit 3 and an adjustment circuit 4 have the same arrangements as in the first embodiment, n=m. In this case, the optimum value holding circuit 8 can also serve as the parallel/series conversion circuit 13.

When the correction circuit has the same arrangement as that of the correction circuit 3A of the third embodiment, the output from the optimum value holding circuit 8 is counted by an adder circuit 10 and then parallel/serial-converted. With this arrangement, the data can be transmitted in a short time. In addition, the scales of the parallel/series conversion circuit 13 and the series/parallel conversion circuit 14 can be made small.

The input circuit 1 and the dummy input circuit shown in FIGS. 2 to 7 are not limited to this type and may be of a differential amplification type.

The input circuit 1 and the dummy input circuit 2 are separately arranged, and so do the correction circuit 3 and the adjustment circuit 4. However, one circuit may be used for both application purposes. For example, a changeover switch is inserted between the input and the output of the input circuit 1. During detection of the optimum value, the input is connected to the reference voltage VREF2 while the output is connected to the buffer circuit 9. In a steady state, the input and output are connected to the input SGIN and the output SGOUT, respectively.

The optimum value holding circuit 8 is constituted by eight FF circuits. However, the number of FF circuits can be changed, as needed.

The interface circuit has been described above on the assumption of use as an interface for a memory circuit. However, the interface circuit is not limited to a memory circuit and can also be applied to another circuit which operates at a high-speed.

As has been described above, according to the present invention, the second and fourth n-type transistors for power down of the interface circuit are connected in series to the first n-type transistor for inputting the reference voltage and the third n-type transistor for inputting/outputting a signal, respectively, and also connected to the ground side. With this arrangement, even when the internal power supply voltage of the interface circuit lowers, the third transistor can ensure a sufficient operating voltage and generate a high-speed output signal following up a high-speed input signal.

The first input circuit (interface circuit), the correction circuit for correcting the current amount of the first input circuit, and the second input circuit having the same arrangement as that of the first input circuit are arranged. For the second input circuit, the optimum value holding circuit and the adjustment circuit detect the optimum operating current amount and set the current amount in the correction circuit. With this arrangement, even when the power supply voltage of the first input circuit lowers, the first input circuit is operated at a different reference voltage, or the transistor characteristics of the first input circuit vary, the optimum operating current can be obtained, and a signal following up a high-speed input signal can be output.

What is claimed is:

1. An interface circuit comprising:
    first and second current mirror circuits each having a current input terminal and a current output terminal;
    a first input circuit including:
        a first transistor having a gate to which an input signal is input and a drain connected to said current output terminal of said first current mirror circuit;
    a second input circuit including a second transistor having a gate, to which a predetermined reference voltage is input, and a drain connected to said current output terminal of said second current mirror circuit; and
    reference setting means connected to each said current input terminal, comprising:
        current amount setting means, and
        logic level determination means for determining a setting current amount, output from said current amount setting means and for feeding back a result to said current amount setting means based upon that determination;
    said reference setting means setting an output current amount flowing to each said current output terminal as a logic determination level of said first transistor.

2. A circuit according to claim 1, wherein said first and second current mirror circuits each include a third transistor and a fourth transistor, wherein:
    a gate of said third transistor is connected to a gate of said fourth transistor;
    each said current input terminal is connected to the gate and a drain of a respective said third transistor; and
    each said current output terminal is connected to a drain of a respective said fourth transistor.

3. A circuit according to claim 1, wherein said current amount setting means comprises:
    an optimum value holding circuit for correcting information to be held on the basis of said result output from said logic level determination means, and
    an adjustment circuit for increasing/decreasing said setting current amount on the basis of an output from said optimum value holding circuit.

4. A circuit according to claim 3, wherein said optimum value holding circuit comprises a plurality of latch circuits.

5. A circuit according to claim 3, wherein said optimum value holding circuit comprises a plurality of shift registers.

6. A circuit according to claim 4, wherein the number of said plurality of latch circuits is $2^m$ (m is a positive integer).

7. A circuit according to claim 5, wherein the number of said plurality of shift registers is $2^m$.

8. A circuit according to claim 3, wherein said adjustment circuit comprises a transistor array formed by interconnecting a plurality of transistor constituent elements, whereby
    drains of said transistor constituent elements of said transistor array are interconnected to each other and to said current input terminal of said second current mirror, gates are connected to outputs of said optimum value holding circuit, respectively, and sources are connected to ground.

9. A circuit according to claim 8, wherein each of said transistor constituent elements comprises fifth and sixth transistors,
    a drain of said fifth transistor is connected to said current input terminal of said second current mirror,
    a source of said fifth transistor is connected to a drain of said sixth transistor, and
    a gate of one of said fifth and sixth transistors is connected to a corresponding one of the outputs of said optimum value holding circuit while a predetermined voltage is supplied to a gate of the other transistor.

10. A circuit according to claim 1, wherein said logic level determination means comprises:
    a buffer circuit coupled to said second input circuit for amplifying an output from said second input circuit and feeding back the output to said current amount setting means.

11. A method of setting a determination level for an interface circuit comprising
    first and second current mirror circuits each having a current input terminal and a current output terminal,
    a first input circuit having a first transistor, said first transistor having a gate to which an input signal is input and a drain connected to said current output terminal of said first current mirror circuit to determine a logic level of the input signal on the basis of a current amount setting at said current input terminal of said first current mirror circuit, and
    a second input circuit having a second transistor having a gate to which a predetermined reference voltage is input and a drain connected to said current output terminal of said second current mirror circuit, comprising:
        the step S1 of setting a predetermined current amount as a current at said current input terminal of said second current mirror circuit;
        the step S2 of inputting the predetermined reference voltage to said second transistor;
        the step S3 of flowing the predetermined current amount to said second transistor to determine an output when the predetermined reference voltage is input;
        the step S4 of storing a determination result in step S3 in optimum value holding means;
        the step S5 of resetting the current amount at said current input terminal of said second current mirror circuit on the basis of the stored result; and
        the step S6 of repeating processing from the step S2 to the step S5 at least a number of times equal to the number of said optimum value holding means.

12. A method according to claim 11, wherein processing from the step S1 to the step S6 is performed when said interface circuit is powered on.

13. A method according to claim 11, wherein processing from the step S1 to the step S6 is performed when operation of said interface circuit is restarted from a standby state.

14. A method according to claim 11, further comprising, after the step S6, the step of stopping the current flowing to said second input circuit through the current input terminal of said second current mirror circuit.

15. A method according to claim 11, wherein the step S5 comprises binary-converting set data and transferring the data to a correction circuit connected to said first input circuit at said current input terminal.

16. A method according to claim 11, wherein the step S5 comprises serially converting set data and transferring the data to a correction circuit connected to said first input circuit at said current input terminal.

* * * * *